(12) United States Patent  
Park

(10) Patent No.: US 7,795,932 B2  
(45) Date of Patent: Sep. 14, 2010

(54) RESET SIGNAL GENERATOR AND A METHOD FOR GENERATING RESET SIGNAL OF A SEMICONDUCTOR INTEGRATED CIRCUIT

(75) Inventor: Nak-Kyu Park, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/266,303

(22) Filed: Nov. 6, 2008

(65) Prior Publication Data

US 2009/0206890 A1 Aug. 20, 2009

(30) Foreign Application Priority Data

Feb. 15, 2008 (KR) .................. 10-2008-0013788

(51) Int. Cl.
*H03L 7/00* (2006.01)

(52) U.S. Cl. ...................... 327/143; 327/142

(58) Field of Classification Search ............. 327/142, 327/143, 333
See application file for complete search history.

(56) References Cited

U.S. PATENT DOCUMENTS

| 5,627,867 | A | * | 5/1997 | Thomson ............... 377/16 |
| 5,929,675 | A | | 7/1999 | Lee |
| 6,173,436 | B1 | * | 1/2001 | Ciccone et al. ............. 716/19 |
| 6,903,616 | B2 | * | 6/2005 | Yin et al. ................. 331/57 |
| 7,057,427 | B2 | * | 6/2006 | Wadhwa et al. ............ 327/143 |
| 7,174,473 | B2 | * | 2/2007 | Musumeci et al. ......... 713/400 |
| 7,626,576 | B2 | * | 12/2009 | Anandakumar et al. ..... 345/173 |
| 2004/0010728 | A1 | * | 1/2004 | Musumeci et al. ......... 713/400 |
| 2006/0012409 | A1 | * | 1/2006 | Wadhwa et al. ............ 327/143 |
| 2007/0233903 | A1 | * | 10/2007 | Pyeon .................... 710/1 |
| 2009/0167746 | A1 | * | 7/2009 | Yoon ..................... 345/211 |
| 2009/0177819 | A1 | * | 7/2009 | Kang .................... 710/105 |
| 2009/0256597 | A1 | * | 10/2009 | Har et al. ............... 327/143 |

FOREIGN PATENT DOCUMENTS

| JP | 55-001672 | 1/1980 |
| JP | 11-288588 | 10/1999 |
| JP | 2005-210596 | 8/2005 |
| JP | 2006-042213 | 2/2006 |
| KR | 1019960043184 | 12/1996 |
| KR | 1020030027217 | 4/2003 |

* cited by examiner

*Primary Examiner*—Lincoln Donovan  
*Assistant Examiner*—Adam D Houston  
(74) *Attorney, Agent, or Firm*—Baker & McKenzie LLP

(57) ABSTRACT

A reset signal generator of a semiconductor integrated circuit includes a counter that counts a clock signal in response to activation of a power-up signal and activates a count-result signal when the counted value reaches a target value, and a reset signal generating unit that activates a reset signal in response to the activation of the count result signal.

9 Claims, 3 Drawing Sheets

RESET SIGNAL GENERATOR AND A METHOD FOR GENERATING RESET SIGNAL OF A SEMICONDUCTOR INTEGRATED CIRCUIT

CROSS-REFERENCES TO RELATED APPLICATION

The present application claims priority under 35 U.S.C. §119(a) to Korean patent application number 10-2008-0013788, filed on Feb. 15, 2008, in the Korean Intellectual Property Office, which is incorporated herein by reference in its entirety as if set forth in full.

BACKGROUND

1. Technical Field

The embodiments described herein relate to a semiconductor integrated circuit (IC), and more particularly, to a reset signal generator and a method for generating a reset signal of a semiconductor IC.

2. Related Art

Generally, a semiconductor IC is commonly uses an internally generated power-up signal for initializing the semiconductor IC in order to perform a stable operation. However, a level of the power-up signal may fluctuate according to fluctuations of a slope and a process/voltage/temperature (PVT) when power is supplied from an exterior of the IC, such that the power-up signal is not suitable for stably initializing the semiconductor IC. Thus, some semiconductor ICs, i.e., a memory group above Graphics Double Data Rate 3 (GDDR3), use a method in which an external memory controller determines whether power is stable in order to supply a reset signal 'RES' to the semiconductor IC, as shown in FIG. 1.

However, when the memory controller supplies the reset signal 'RES' to the semiconductor IC, a separate pin for receiving the reset signal 'RES' and a circuit configuration for controlling the reset signal 'RES' must be included in the semiconductor IC. Furthermore, since the size of the semiconductor IC is gradually decreasing, the addition of the separate pin and the circuit configuration for the reset signal 'RES' is problematic in that it inhibits the reduction in size of the semiconductor IC. The determination on whether power is stable is performed at the exterior of the semiconductor IC. Accordingly, the stability of the semiconductor IC is questionable when a difference exists between the desired power and the actual power being used inside the semiconductor IC.

SUMMARY

A reset signal generator and a method for generating a reset signal of a semiconductor IC capable of reducing circuit area and achieving stable initialization is described herein.

In one aspect, a reset signal generator of a semiconductor integrated circuit includes a counter that counts a clock signal in response to activation of a power-up signal and activates a count-result signal when the counted value reaches a target value, and a reset signal generating unit that activates a reset signal in response to the activation of the count result signal.

In another aspect, a reset signal generator of a semiconductor integrated circuit includes a power-up signal generator that activates a power-up signal when an external power level reaches a target level, and a counter that counts a clock signal in response to the activation of the power-up signal and activates a reset signal when the counted value reaches a target value.

In another aspect, a method for generating a reset signal of a semiconductor integrated circuit includes determining whether a setup time has elapsed from an activation time point of a power-up signal, and activating a reset signal after the setup time has elapsed.

In another aspect, a reset signal generator of a semiconductor integrated circuit includes a power-up signal generator that activates a power-up signal when an external power level reaches a target level, a stabilization time determining unit that determines whether a setup time has elapsed in response to activation of the power-up signal, and a reset signal generating unit that outputs a reset signal in response to an output of the stabilization time determining unit.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
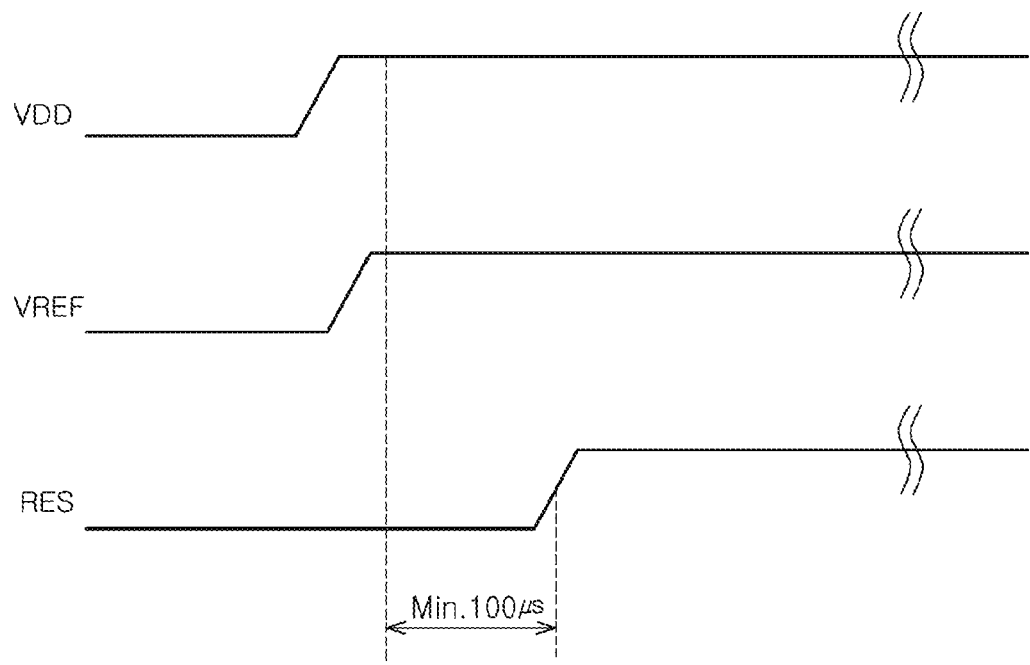
FIG. 1 is a timing diagram demonstrating a conventional method for generating a reset signal.
Figure 2:
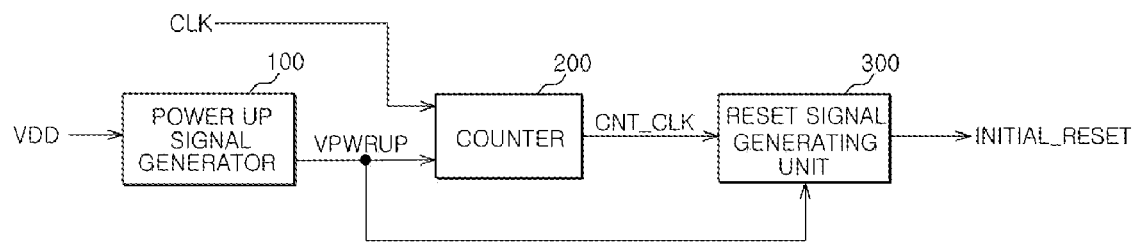
FIG. 2 is a schematic circuit diagram of an exemplary reset signal generator of a semiconductor IC according to one embodiment.

FIG. 2 is a schematic circuit diagram of an exemplary reset signal generator of a semiconductor IC according to one embodiment. In FIG. 2, a reset signal generator 1 of a semiconductor IC can be configured to include a power-up signal generator 100, a counter 200, and a reset signal generating unit 300.

The power-up signal generator 100 can be arranged to activate a power-up signal 'VPWRUP' when the external power VDD level reaches a target level. In addition, the counter 200 can be arranged to operate as a stabilization time determining unit for determining a time period required for a stabilized reset of the semiconductor IC, i.e., a stabilization time period.

The counter 200 can be arranged to count a clock signal 'CLK' from a time point after activation of the power-up signal 'VPWRUP' and activate a count-result signal 'CNT_CLK' when the counted value reaches a target value. In addition, the counter 200 can be configured to output an output signal corresponding to the most significant bit among a number of N-bit (N is a natural number more than two) output signals as the count-result signal 'CNT_CLK', wherein the N-bit value can be set to meet the target value. For example, if the target value is 1K (1024), then N can be set to 11. Accordingly, when the counter 200 counts a $1024^{th}$ clock pulse, the most significant bit (A<10>) among the 11-bit output signals (for example, A<0:10>) can be transitioned to a high level. In addition, the clock signal 'CLK' can be supplied from an exterior of the semiconductor IC.

A predetermined amount of time, hereinafter referred to as a power stabilization time, can be required to stabilize the external power VDD in order to be suitably used within the semiconductor IC after the external power VDD is supplied to the semiconductor IC. The power stabilization time can be different according to a power supply voltage level, the type and operation mode of the semiconductor IC, and can be found through testing, for example.

Here, the clock signal 'CLK' can be used as criteria for determining the power stabilization time, wherein a time interval (tCK) of the clock signal 'CLK' is known. Accordingly, the N-bits can be set so that the target value can meet the power stabilization time and the number of clock signals 'CLK' to be counted by the counter 200.

The reset signal generating unit 300 can be configured to activate a reset signal 'INITIAL_RESET' in response to the activation of the count-result signal 'CNT_CLK', and to maintain the activation state of the reset signal 'INITIAL_RESET' until the power-up signal 'VPWRUP' is in an inactivated state. The counting value of the counter 200 can continue to increase according to a repetitive input of the clock signal 'CLK', and thus, the count-result signal 'CNT_CLK' also can be transitioned to the inactivated state. As a result, even when the count-result signal 'CNT_CLK' is inactivated, the reset signal generating unit 300 can maintain the reset signal 'INITIAL_RESET' at an activation level until the power-up signal 'VPWRUP' is in the inactivated state.

Figure 3:
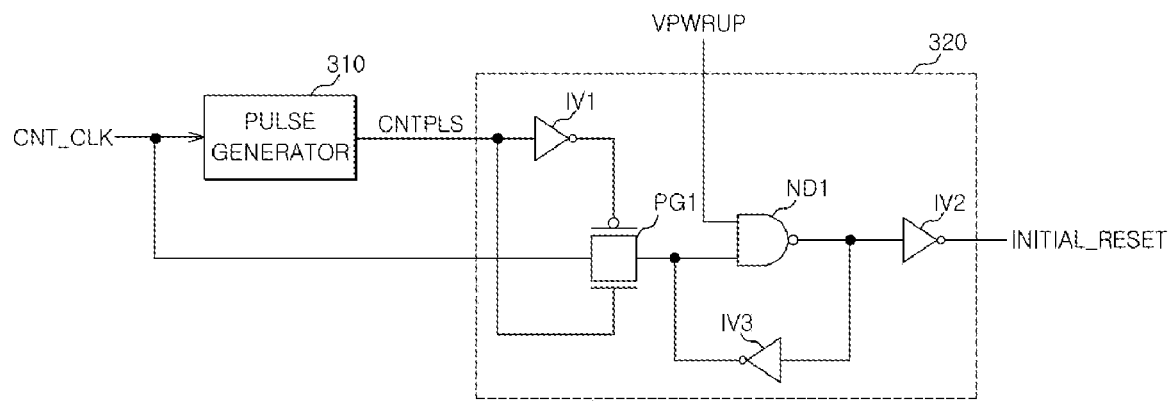
FIG. 3 is a schematic circuit diagram of an exemplary reset signal generating unit that can be included in the reset signal generator of FIG. 2 according to one embodiment.

FIG. 3 is a schematic circuit diagram of an exemplary reset signal generating unit of FIG. 2 according to one embodiment. In FIG. 3, the reset signal generating unit 300 can include a pulse generator 310 and a logic circuit 320. The pulse generator 310 can be configured to include a transfer element and a logic element to generate a count-pulse signal 'CNTPLS' when the count-result signal 'CNT_CLK' is activated to a high level.

The logic circuit 320 can be configured to generate the reset signal 'INITIAL_RESET' according to the power-up signal 'VPWRUP' and the count-result signal 'CNT_CLK' can be latched according to the count-pulse signal 'CNTPLS'. The logic circuit 320 can include first to third inverters IV1 to IV3, a pass gate PG1, and a NAND gate ND1. The transfer element can include of the first inverter IV1 and the pass gate PG1, and the logic element can include the second and the third inverters IV2 and IV3, and the NAND gate ND1, wherein the first inverter IV1 can receive the count-pulse signal 'CNTPLS'. The pass gate PG1 can include an input terminal receiving the count-result signal 'CNT_CLK', a first control terminal receiving an output signal of the first inverter IV1, and a second control terminal receiving the count-pulse signal 'CNTPLS'. The NAND gate ND1 can include a first input terminal receiving the power-up signal 'VPWRUP', and a second input terminal receiving an output of the third inverter IV3 and an output of the pass gate PG1. The second inverter IV2 can receive an output of the NAND gate ND1 to output the reset signal 'INITIAL_RESET'.

Figure 4:
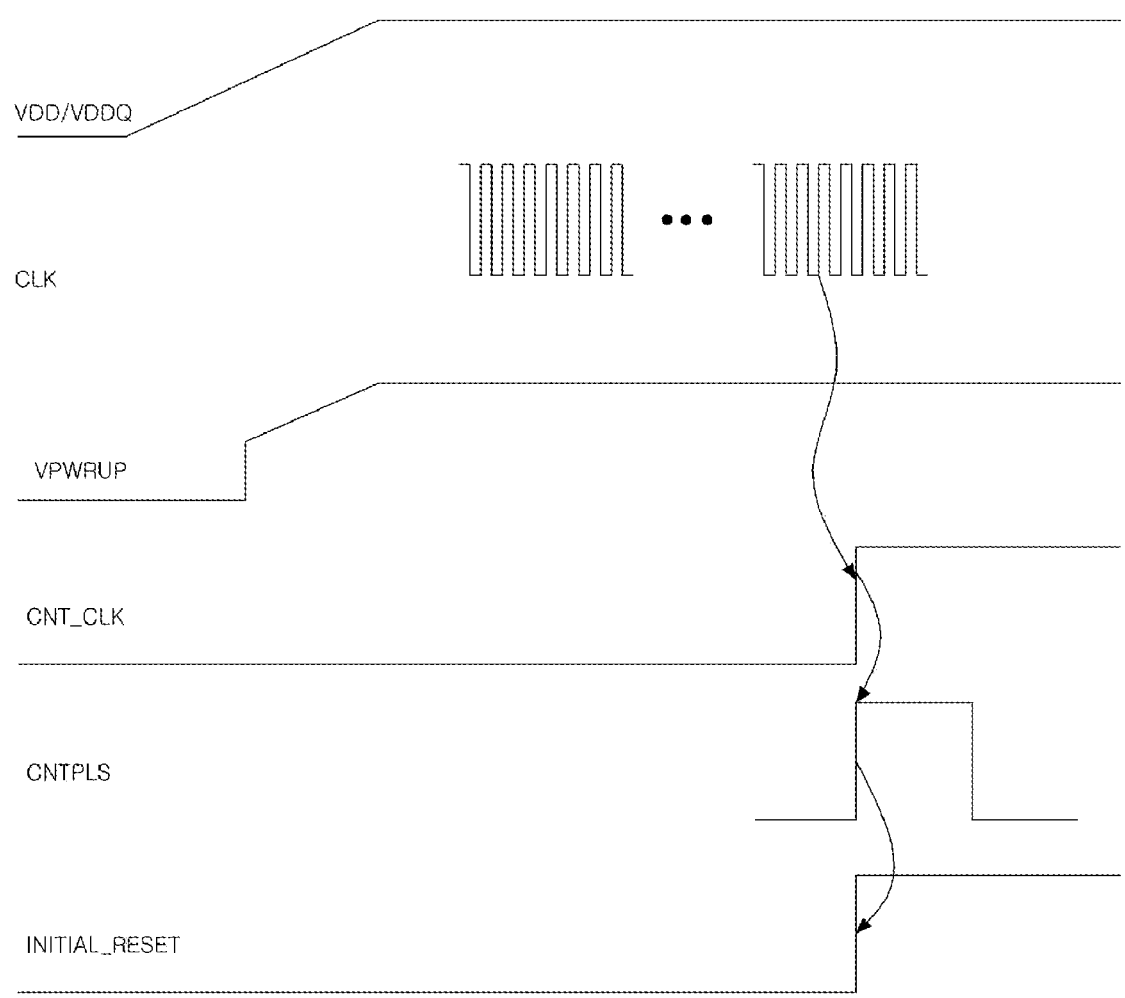
FIG. 4 is an operation timing diagram demonstrating an exemplary method for generating a reset signal of a semiconductor IC according to one embodiment.

FIG. 4 is an operation timing diagram demonstrating an exemplary method for generating a reset signal of a semiconductor IC according to one embodiment. An exemplary operation of the reset signal generator 1 for generating the reset signal 'INITIAL_RESET' of a semiconductor IC configured as detailed above will be described with regard to FIGS. 3 and 4.

Initially, the external power VDD level is not sufficiently increased at an initial stage of when the external power VDD is supplied so that the power-up signal 'VPWRUP' can be in an inactivated state at a low level. The reset signal generating unit 300 is activated and outputs the reset signal 'INITIAL_RESET' at a low level since the power-up signal 'VPWRUP' is in the inactivated state at a low level. Thereafter, the power-up signal generator 100 can activate and output the power-up signal 'VPWRUP' when the external power VDD level rises and then exceeds the target level.

The counter 200 uses the power-up signal 'VPWRUP' as an enable signal to start the counting operation of the clock signal 'CLK' input from the exterior of the semiconductor IC. Then, the counter 200 can activate the count-result signal 'CNT_CLK' to a high level when the counting value of the clock signal 'CLK' reaches the target value. In addition, the pulse generator 310 can generate the count-pulse signal 'CNTPLS' since the count-result signal 'CNT_CLK' is activated at a high level.

The logic circuit 320 can output the high-level count-result signal 'CNT_CLK' through the pass gate PG1 during a high level period of the count-pulse signal 'CNTPLS'. When the power-up signal 'VPWRUP' is activated at a high level, the reset signal 'INITIAL_RESET' can be activated at a high level by the NAND gate ND1 and the second inverter IV2. Thereafter, even when the count-result signal 'CNT_CLK' is inactivated at a low level according to the repetitive counting operation of the counter 200, the count-pulse signal 'CNTPLS' cannot be generated and the reset signal 'INITIAL_RESET' can be maintained at a high level since the power-up signal 'VPWRUP' is activated at a high level. Similarly, when the power-up signal 'VPWRUP' is again inactivated at a low level, the reset signal 'INITIAL_RESET' can be transitioned at a low level regardless of the count-result signal 'CNT_CLK'.

In another embodiment, the reset signal generator can be configured for generating the reset signal including only the power-up signal generator 100 and a second exemplary counter. For example, the second exemplary counter can be configured to latch the count-result signal 'CNT_CLK' upon activation as the counting value of the clock signal 'CLK' reaches the target value, and can output the latched count-result signal 'CNT_CLK' as the reset signal 'INITIAL_RESET'. Accordingly, although the counting value can be continuously increased, the value of the count-result signal 'CNT_CLK' cannot be changed, wherein the reset signal generating unit 300 is unnecessary.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A device for generating a reset signal of a semiconductor integrated circuit, comprising:
a counter that counts a clock signal in response to activation of a power-up signal and activates a count-result signal when the counted value reaches a target value; and
a reset signal generator that activates the reset signal in response to the activation of the count result signal,
wherein the reset signal generator comprises:
a pulse generator configured to generate a count-pulse signal in response to the activation of the count-result signal; and
a logic circuit configured to generate the reset signal according to the power-up signal and the count-result signal latched according to the count-pulse signal.

2. The device of claim 1, further comprising a power-up generator that activates the power-up signal when an external power level reaches a target level.

3. The device of claim 1, wherein the counter is configured to output, as the count result signal, an output signal corresponding to the most significant bit among a number of N-bit (N is a natural number more than two) output signals.

4. The device of claim 1, wherein the reset signal generator activates the reset signal in response to the activation of the count-result signal and maintains the activation state of the reset signal until the power-up signal is inactivated.

5. The device of claim 1, wherein the logic circuit includes:
   a transfer element that passes the count-result signal according to the count-pulse signal; and
   a logic element that latches an output signal of the transfer element according to the power-up signal to be output as the reset signal.

6. A device for generating a reset signal of a semiconductor integrated circuit, comprising:
   a power-up signal generator that activates a power-up signal when an external power level reaches a target level;
   a stabilization time determining unit that determines whether a setup time has elapsed in response to activation of the power-up signal; and
   a reset signal generator that outputs the reset signal in response to an output of the stabilization time determining unit,
   wherein the reset signal generator comprises:
      a pulse generator configured to generate a count-pulse signal in response to the output of the stabilization time determining unit; and
      a logic circuit configured to generate the reset signal according to the power-up signal and the output of the stabilization time determining unit latched according to the count-pulse signal.

7. The device of claim 6, wherein the stabilization time determining unit includes a counter that counts a clock signal in response to the activation of the power-up signal and outputs a signal according to whether the counted value reaches a target value.

8. The device of claim 6, wherein the reset signal generator is configured to activate the reset signal in response to an output of the stabilization time determining unit and maintain the activation state of the reset signal until the power-up signal is inactivated.

9. The device of claim 6, wherein the logic circuit includes:
   a transfer element that passes the output of the stabilization time determining unit according to the count-pulse signal; and
   a logic element that latches an output signal of the transfer element according to the power-up signal to be output as the reset signal.

* * * * *